(12) United States Patent
Xie et al.

(10) Patent No.: US 11,909,417 B2
(45) Date of Patent: *Feb. 20, 2024

(54) DATA PROCESSING METHOD AND DEVICE

(71) Applicant: ZTE CORPORATION, Guangdong (CN)

(72) Inventors: Saijin Xie, Shenzhen (CN); Jun Xu, Shenzhen (CN); Jin Xu, Shenzhen (CN); Mengzhu Chen, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/825,567

(22) Filed: May 26, 2022

(65) Prior Publication Data
US 2022/0376708 A1    Nov. 24, 2022

Related U.S. Application Data

(63) Continuation of application No. 17/348,138, filed on Jun. 15, 2021, which is a continuation of application (Continued)

(30) Foreign Application Priority Data

Jan. 9, 2017  (CN) .......................... 201710014452.9
Feb. 15, 2017 (CN) .......................... 201710080047.7

(51) Int. Cl.
*H03M 13/13*   (2006.01)
*H03M 13/09*   (2006.01)
(Continued)

(52) U.S. Cl.
CPC ....... *H03M 13/136* (2013.01); *H03M 13/091* (2013.01); *H04L 1/0057* (2013.01); *H04W 72/23* (2023.01)

(58) Field of Classification Search
CPC ... H04L 1/0041; H04L 1/0057; H04L 1/0061; H03M 13/091; H03M 13/13;
(Continued)

(56) References Cited

U.S. PATENT DOCUMENTS

| 8,219,877 B2 | 7/2012 | Kim et al. |
| 8,347,186 B1 * | 1/2013 | Arikan .................. H04L 1/0009 |
| | | 714/781 |

(Continued)

FOREIGN PATENT DOCUMENTS

| CA | 3042955 A1 * | 6/2018 | ............ H03M 13/09 |
| CA | 2972832 C * | 10/2021 | ............ H03M 13/13 |

(Continued)

OTHER PUBLICATIONS

Ericsson: "Remaining Issues of Polar Code Construction for UCI and DCI" 3GPP TSG RAN WG1 Meeting 90bis; R1-1717995; Oct. 13, 2017; Prague, Czech (19 pages).
(Continued)

*Primary Examiner* — Eric Nowlin
(74) *Attorney, Agent, or Firm* — Foley & Lardner LLP

(57) ABSTRACT

A data processing method and apparatus. The data process method includes: determining, by a transmitting node, a code block length $N_0$ for encoding an information bit sequence to be transmitted according to a data characteristic for representing the information bit sequence to be transmitted and a preset parameter corresponding to the data characteristic; performing, by the transmitting node, polar encoding on the information bit sequence to be transmitted according to the code block length $N_0$; and transmitting, by the transmitting node, a code block obtained through the polar encoding to a receiving node.

18 Claims, 4 Drawing Sheets

Related U.S. Application Data

No. 16/505,234, filed on Jul. 8, 2019, now Pat. No. 11,038,532, which is a continuation of application No. PCT/CN2018/071887, filed on Jan. 9, 2018.

(51) Int. Cl.
  *H04L 1/00* (2006.01)
  *H04W 72/23* (2023.01)

(58) Field of Classification Search
  CPC .......... H03M 13/136; H03M 13/2906; H03M 13/6516; H04W 72/042
  See application file for complete search history.

(56) References Cited

U.S. PATENT DOCUMENTS

| | | | |
|---|---|---|---|
| 9,059,739 B2* | 6/2015 | Arikan | H04L 1/0043 |
| 9,148,177 B2* | 9/2015 | Arikan | H03M 13/13 |
| 9,154,162 B2 | 10/2015 | Kim et al. | |
| 9,246,513 B2 | 1/2016 | Kim et al. | |
| 9,362,957 B2* | 6/2016 | Arikan | H04L 1/0041 |
| 9,742,440 B2 | 8/2017 | El-Khamy et al. | |
| 9,912,444 B2 | 3/2018 | Kim et al. | |
| 10,231,121 B2 | 3/2019 | Ahn et al. | |
| 10,257,818 B2 | 4/2019 | Oketani | |
| 10,389,485 B2 | 8/2019 | Zhou et al. | |
| 10,411,835 B2* | 9/2019 | Murakami | H04L 1/0041 |
| 10,574,265 B2 | 2/2020 | Palgy et al. | |
| 10,615,915 B2 | 4/2020 | Andersson et al. | |
| 10,735,140 B2 | 8/2020 | Cirkic et al. | |
| 10,742,349 B2 | 8/2020 | Yeo et al. | |
| 10,778,370 B2 | 9/2020 | Sarkis et al. | |
| 10,841,063 B2 | 11/2020 | Nammi et al. | |
| 10,965,399 B2* | 3/2021 | Gritsenko | H04L 1/0042 |
| 11,032,027 B2* | 6/2021 | Murakami | H03M 13/616 |
| 11,038,532 B2 | 6/2021 | Xie et al. | |
| 11,133,826 B2 | 9/2021 | Li et al. | |
| 11,233,529 B2* | 1/2022 | Dikarev | H03M 13/2703 |
| 11,405,055 B2* | 8/2022 | Arikan | H03M 13/2906 |
| 11,502,782 B2* | 11/2022 | Murakami | H03M 13/616 |
| 11,664,825 B2* | 5/2023 | Dikarev | H03M 13/13 714/758 |
| 2007/0124643 A1 | 5/2007 | Golitschek Edler Von Elbwart et al. | |
| 2008/0025257 A1 | 1/2008 | Laroia et al. | |
| 2009/0070653 A1 | 3/2009 | Kim et al. | |
| 2009/0199066 A1 | 8/2009 | Kim et al. | |
| 2012/0240009 A1 | 9/2012 | Kim et al. | |
| 2013/0262963 A1 | 10/2013 | Kim et al. | |
| 2013/0283116 A1* | 10/2013 | Arikan | H04L 1/0041 714/752 |
| 2014/0173376 A1 | 6/2014 | Jeong et al. | |
| 2015/0244497 A1* | 8/2015 | Arikan | H03M 13/13 714/776 |
| 2015/0349922 A1* | 12/2015 | Arikan | H04L 1/0043 714/776 |
| 2016/0094313 A1 | 3/2016 | Kim et al. | |
| 2016/0182187 A1 | 6/2016 | Kim et al. | |
| 2016/0285479 A1 | 9/2016 | El-Khamy et al. | |
| 2016/0294418 A1 | 10/2016 | Huang et al. | |
| 2016/0294510 A1* | 10/2016 | Murakami | H03M 13/2906 |
| 2016/0335156 A1 | 11/2016 | En Gad et al. | |
| 2016/0380763 A1 | 12/2016 | Ahn et al. | |
| 2017/0155405 A1 | 6/2017 | Ge et al. | |
| 2017/0257849 A1 | 9/2017 | Oketani | |
| 2018/0026747 A1 | 1/2018 | Rong et al. | |
| 2018/0034587 A1 | 2/2018 | Kim et al. | |
| 2018/0041992 A1 | 2/2018 | Bin Sediq et al. | |
| 2018/0076922 A1 | 3/2018 | Zhang et al. | |
| 2018/0323803 A1 | 11/2018 | Palgy et al. | |
| 2018/0367251 A1* | 12/2018 | Zhou | H03M 13/091 |
| 2018/0375612 A1 | 12/2018 | Sarkis et al. | |
| 2019/0028229 A1 | 1/2019 | Yeo et al. | |
| 2019/0173615 A1 | 6/2019 | Andersson et al. | |
| 2019/0296857 A1* | 9/2019 | Gritsenko | H03M 13/3769 |
| 2019/0312706 A1 | 10/2019 | Nammi et al. | |
| 2019/0356419 A1* | 11/2019 | Murakami | H04L 1/0057 |
| 2020/0007161 A1 | 1/2020 | Dikarev et al. | |
| 2020/0007163 A1 | 1/2020 | Huangfu et al. | |
| 2020/0021310 A1 | 1/2020 | Zheng et al. | |
| 2020/0028523 A1 | 1/2020 | Li et al. | |
| 2020/0099399 A1 | 3/2020 | Xie et al. | |
| 2020/0186286 A1 | 6/2020 | Andersson et al. | |
| 2020/0235851 A1 | 7/2020 | Mondelli et al. | |
| 2020/0322086 A1 | 10/2020 | Xu et al. | |
| 2020/0322089 A1 | 10/2020 | Andersson et al. | |
| 2020/0374029 A1 | 11/2020 | Yeo et al. | |
| 2020/0412385 A1* | 12/2020 | Arikan | H03M 13/2906 |
| 2021/0083795 A1 | 3/2021 | Chen et al. | |
| 2021/0111739 A1 | 4/2021 | Hui et al. | |
| 2021/0250124 A1* | 8/2021 | Murakami | H03M 13/2906 |
| 2021/0328603 A1 | 10/2021 | Chen et al. | |
| 2022/0021479 A1* | 1/2022 | Peng | H04L 1/1874 |
| 2022/0123765 A1* | 4/2022 | Dikarev | H03M 13/2789 |
| 2023/0155609 A1* | 5/2023 | Dikarev | H03M 13/6356 714/758 |

FOREIGN PATENT DOCUMENTS

| | | | | |
|---|---|---|---|---|
| CN | 103825669 | A | | 5/2014 |
| CN | 105794117 | A | * 7/2016 | ........ H03M 13/1102 |
| CN | 108574561 | A | | 9/2018 |
| CN | 110463046 | A | * 11/2019 | ............ H03M 13/09 |
| CN | 110546888 | A | * 12/2019 | ............ H03M 13/13 |
| CN | 105794117 | B | * 2/2020 | ........ H03M 13/1102 |
| CN | 110785938 | A | | 2/2020 |
| CN | 115459786 | A | * 12/2022 | ............ H03M 13/09 |
| CN | 110463046 | B | * 9/2023 | |
| DE | 11 2018 001 571 | T5 | | 12/2019 |
| DE | 112018001571 | T5 | * 12/2019 | ............ H03M 13/09 |
| EP | 2802080 | A1 | * 11/2014 | ............ H03M 13/09 |
| EP | 2824841 | A1 | * 1/2015 | ............ H03M 13/13 |
| EP | 2899911 | A1 | * 7/2015 | ............ H03M 13/13 |
| EP | 2 922 227 | A1 | | 9/2015 |
| EP | 2824841 | B1 | * 4/2016 | ............ H03M 13/13 |
| EP | 2802080 | B1 | * 8/2016 | ............ H03M 13/09 |
| EP | 3054599 | A1 | * 8/2016 | ............ H03M 13/05 |
| EP | 3073642 | A1 | * 9/2016 | ........ H03M 13/1105 |
| EP | 3089369 | A1 | * 11/2016 | ........ H03M 13/1102 |
| EP | 3 264 613 | A1 | | 1/2018 |
| EP | 3376695 | A1 | * 9/2018 | ............ H03M 13/13 |
| EP | 3 419 178 | A4 | | 12/2018 |
| EP | 3 584 972 | A | | 12/2019 |
| EP | 3476052 | B1 | * 12/2020 | .......... H03M 13/033 |
| EP | 3447925 | B1 | * 1/2021 | ............ H03M 13/13 |
| EP | 3504801 | B1 | * 4/2021 | ............ H03M 13/13 |
| ES | 2856961 | T3 | * 9/2021 | ............ H03M 13/13 |
| JP | 2015128290 | A | * 7/2015 | ........ H03M 13/1102 |
| JP | 2017500818 | A | * 1/2017 | |
| JP | 6184603 | B2 | * 8/2017 | ........ H03M 13/1105 |
| JP | 2018503331 | A | * 2/2018 | |
| JP | 6481913 | B2 | * 3/2019 | ............ H03M 13/13 |
| JP | 2019216488 | A | * 12/2019 | ........ H03M 13/1102 |
| JP | 6817414 | B2 | * 1/2021 | .......... H03M 13/033 |
| JP | 2022534171 | A | * 7/2022 | |
| JP | 2022544645 | A | * 10/2022 | |
| KR | 20160115803 | A | | 10/2016 |
| KR | 20220028031 | A | * 3/2022 | |
| RU | 2649957 | C2 | * 4/2018 | ........ H03M 13/1105 |
| TW | 201644219 | A | | 12/2016 |
| TW | 202107857 | A | * 2/2021 | ............ H03M 13/13 |
| WO | WO-2013107140 | A1 | * 7/2013 | ............ H03M 13/09 |
| WO | WO-2013152605 | A1 | * 10/2013 | ............ H03M 13/13 |
| WO | WO-2014044072 | A1 | * 3/2014 | ............ H03M 13/13 |
| WO | WO-2015066925 | A1 | * 5/2015 | ............ H03M 13/05 |
| WO | WO-2016/154968 | A1 | | 10/2016 |
| WO | WO-2017/124844 | A1 | | 7/2017 |
| WO | WO-2018/098691 | A1 | | 6/2018 |
| WO | WO-2018/166423 | A1 | | 9/2018 |
| WO | WO-2018/175711 | A1 | | 9/2018 |
| WO | WO-2018175711 | A1 | * 9/2018 | ............ H03M 13/09 |

(56) References Cited

FOREIGN PATENT DOCUMENTS

| WO | WO-2018205282 A1 * | 11/2018 | ............ H03M 13/13 |
|---|---|---|---|
| WO | WO-2019/005807 A1 | 1/2019 | |
| WO | WO-2019/047237 A1 | 1/2019 | |

OTHER PUBLICATIONS

Ericsson: "Remaining Issues of Polar Code Segmentation for UCI" 3GPP TSG RAN WG1 Meeting 91; R1-1719607; Dec. 1, 2017; Reno, US (9 pages).

Extended European Search Report on EP 18736010.2 dated May 20, 2020 (10 pages).

Huawei et al.: "Segmentation for Polar codes" 3GPP TSG RAN WG1 Meeting #90bis; R1-1718372; Oct. 13, 2017; Prague, Czech (5 pages).

Intel Corporation, "Discussion on Control channel coding for NR", 3GPP TSG RAN WG1 Meeting #87 Draft; RI-1612587, Reno, Nevada, Nov. 6, 2016 (Nov. 14-18, 2016), pp. 1-5.

Intel, "RI-1700385, Considerations in Polar Code Design", 3GPP TSG RAN WG 1 Ad hoc, Jan. 20, 2017.

International Search Report and Written Opinion for International Appl. No. PCT/CN2018/071887, dated Mar. 28, 2018.

Nokia et al., "RI-1612282, Code Segmentation for eMBB Data", 3GPP TSG-RAN WG 1 Meeting #87, Nov. 18, 2016.

Non-Final Office Action on U.S. Appl. No. 16/505,234 dated Oct. 16, 2020.

Notice of Allowance on U.S. Appl. No. 16/505,234 dated Feb. 9, 2021.

NTT DoCoMo: "Uplink CRC and nFAR for Polar codes" 3GPP TSG RAN WG1 Meeting 91; R1-1720827; Dec. 1, 2017; Reno, USA (6 pages).

Qualcomm Incorporated, "RI-1711221, Design of Polar Code for Large UCI with Segmentation", 3GPPTSG-RAN WGI NR Ad-Hoc#2, Jun. 30, 2017.

Zte et al., "R1-1718914, Segmentation of Polar Code for Large UCI", 3GPPTSG RAN WGI Meeting #90bis, Oct. 13, 2017.

Non-Final Office Action on U.S. Appl. No. 17/348,138 dated Sep. 15, 2022.

Final Office Action on U.S. Appl. No. 17/348,138 dated Jan. 31, 2023.

* cited by examiner

DATA PROCESSING METHOD AND DEVICE

CROSS-REFERENCE TO RELATED APPLICATIONS

This application claims the benefit of priority under 35 U.S.C. § 120 as a continuation of U.S. Non-Provisional patent application Ser. No. 17/348,138, filed Jun. 15, 2021, which is a continuation of U.S. Non-Provisional patent application Ser. No. 16/505,234, filed on Jul. 8, 2019, which is a continuation of PCT Patent Application No. PCT/CN2018/071887, filed on Jan. 9, 2018, which claims priority to Chinese patent application no. 201710080047.7, filed on Feb. 15, 2017, and to Chinese patent application no. 201710014452.9, filed on Jan. 9, 2017, the disclosure of each of which is incorporated herein by reference in its entirety.

TECHNICAL FIELD

The present disclosure relates to the field of wireless communications and, for example, to a data processing method and apparatus.

BACKGROUND

Due to the presence of channel noise, the channel coding service, as an independent part of the mobile communication system, can provide reliability, accuracy, and validity of information transmission. In 5G communications, spectral efficiency and reliability may be desired to be significantly improved. A polar code is a linear block code that has been proved in theory to be capable of obtaining the Shannon capacity and has low coding and decoding complexity. The polar code is a competitive channel encoding scheme in 5G mobile communications. An encoding method for the polar code is usually to directly determine a length of a code block (i.e., a length of a codeword sequence) and obtain the required code block by use of a generation matrix according to the information bit size and the code rate regardless of the length of the code block.

In the encoding process, the length of an output of the encoder is usually dynamically adjusted according to the information bit size and the code rate, which is not conducive to hardware implementation. In addition, the delay and complexity of both the encoder and the decoder increase with an increase in the length of the code block. Due to the limited hardware capability, a too large length of the code block may result in impossible encoding.

SUMMARY

The present disclosure provides a data processing method and apparatus to facilitate hardware implementation of encoding.

The present disclosure provides a data processing method. The method may include steps described below.

A transmitting node determines a code block length $N_0$ for encoding an information bit sequence to be transmitted according to a data characteristic for representing the information bit sequence to be transmitted and a preset parameter corresponding to the data characteristic.

The transmitting node performs polar encoding on the information bit sequence to be transmitted according to the code block length $N_0$.

The transmitting node transmits a code block obtained through the polar encoding to a receiving node. The present disclosure further provides a data processing apparatus. The apparatus may include a determination module, an encoding module, and a transmitting module.

The determination module is configured to determine a code block length $N_0$ for encoding an information bit sequence to be transmitted according to a data characteristic for representing the information bit sequence to be transmitted and a preset parameter corresponding to the data characteristic.

The encoding module is configured to perform polar encoding on the information bit sequence to be transmitted according to the code block length $N_0$.

The transmitting module is configured to transmit a code block obtained through the polar encoding to a receiving node.

The present disclosure further provides a data processing device. The device may include a first memory and a first processor.

The first memory is configured to store programs.

The first processor is configured to execute the programs to perform the operations described below.

A transmitting node determines a code block length $N_0$ for encoding an information bit sequence to be transmitted according to a data characteristic for representing the information bit sequence to be transmitted and a preset parameter corresponding to the data characteristic. The transmitting node performs polar encoding on the information bit sequence to be transmitted according to the code block length $N_0$. The transmitting node transmits a code block obtained through the polar encoding to a receiving node.

The present disclosure further provides a computer-readable storage medium configured to store computer-executable instructions for executing any method described above.

The present disclosure further provides a transmitter device. The device may include one or more processors, a memory, and one or more programs, where when executed by the one or more processors, the one or more programs, which are stored in the memory, execute any method described above.

The present disclosure further provides a computer program product. The computer program product includes a computer program stored in a non-transient computer-readable storage medium. The computer program includes program instructions that, when executed by a computer, enable the computer to execute any method described above.

The data processing method and apparatus provided by the present application may prevent a code block from being frequently and dynamically changed and facilitate hardware implementation.

DETAILED DESCRIPTION

Figure 1:
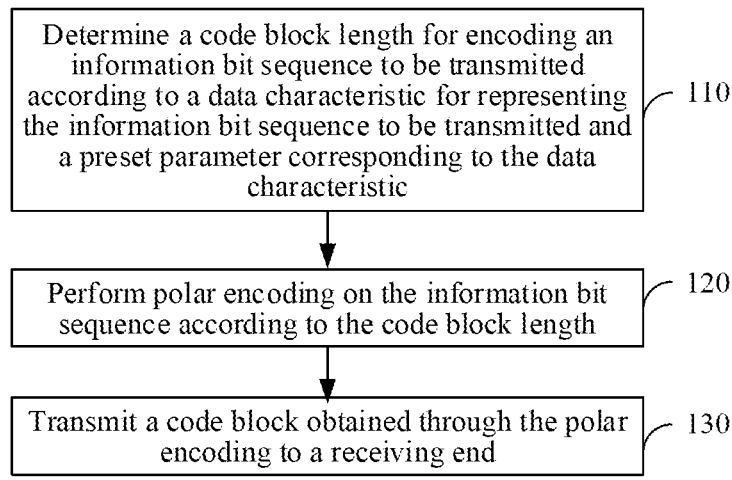
FIG. 1 is a flowchart of a data processing method according to an embodiment of the present disclosure.

The steps shown in the flowcharts in the drawings may be performed by a computer system such as a group of computers capable of executing instructions. Although logical sequences are shown in the flowcharts, the shown or described steps may be performed in sequences different from those described herein in some cases.

This embodiment provides a data processing method which may, but is not limited to, be applied in the new radio access technology (NR).

A transmitting node described in this embodiment may be a base station. The transmitting node may include, but is not limited to, a gNodeB (gNB). The transmitting node may also be a user equipment (UE). A receiving node described in this embodiment may be a UE or a base station, and may include, but is not limited to, a gNB.

FIG. 1 shows a data processing method provided in this embodiment. As shown in FIG. 1, the method may include steps 110 to 130.

In step 110, a transmitting node determines a code block length $N_0$ for encoding an information bit sequence to be transmitted according to a data characteristic for representing the information bit sequence to be transmitted and a preset parameter corresponding to the data characteristic. $N_0$ is a maximum value of a mother code block for polar encoding.

In step 120, the transmitting node performs the polar encoding on the information bit sequence to be transmitted according to the code block length $N_0$.

In step 130, the transmitting node transmits a code block obtained through the polar encoding to a receiving node.

Optionally, before the transmitting node performs the polar encoding on the information bit sequence to be transmitted according to the code block length $N_0$, the method includes a step described below. The transmitting node determines a code block number C according to the code block length $N_0$. When N satisfies a first segmentation condition, $N \geq N_0 + A$, the transmitting node performs code block segmentation on the information bit sequence, and the code block number is $C \geq 2$, where N is a practical code block length required by the information bit sequence, and A is a fixed increment. When $N < N_0 + \Delta$, the code block number is $C = 1$, and the code block segmentation is not performed.

When N satisfies the first segmentation condition, $N > N_0 + \Delta$ the code block number determined by the transmitting node may also be calculated according to a formula $$C = \left\lceil \frac{N}{N_0 + \Delta} \right\rceil,$$

where $\Delta$ is the fixed increment and $\lceil \cdot \rceil$ denotes rounding up, $$0 \leq \frac{\Delta}{N_0} \leq R_0,$$

$R_0$ is a preset positive real number and is determined according to experience or simulation, and when $0 \leq R_0 \leq 1$, $0 \leq \Delta \leq N_0$. Especially, when $N_0 = 1024$, a value of $\Delta$ may be 64.

The transmitting node determines the code block number C according to a length of the information bit sequence to be transmitted. When K satisfies a second segmentation condition, $K \geq K_{max}$, the code block number is $C \geq 2$, and the transmitting node performs code block segmentation on the information bit sequence. When $K < K_{max}$, the code block number is $C = 1$, and the code block segmentation is not performed, where K is the length of the information bit sequence to be transmitted, and $K_{max}$ is a length of preset maximum information bit sequence length.

$C > 1$ in the subsequent embodiments refers to $C \geq 2$.

When K satisfies the second segmentation condition, $K > K_{max}$, the code block number determined by the transmitting node may also be calculated according to a formula $$C = \left\lceil \frac{K}{K_{max}} \right\rceil.$$

The above two segmentation formulas give the first segmentation condition and the second segmentation condition. The first segmentation condition is applicable to a high code rate and a case where the information bit sequence to be transmitted has large length. The second segmentation condition is applicable to a low code rate and a case where the information bit sequence to be transmitted is allocated with a large number of available resources. The code block segmentation may also be performed when both the first segmentation condition and the second segmentation condition are satisfied. When the two segmentation conditions are satisfied, the code block number may be 2. The transmitting node processes the information bit sequence to be transmitted to obtain C code blocks.

Optionally, $N_0$ may be set according to scenarios which may include a link direction or different types of channels. For example, one value is set for an uplink (UL) channel, one value is set for a downlink (DL) control channel, and one value is set for a DL traffic channel.

Optionally, the data characteristic includes one or more of: an information bit sequence length, a modulation and coding scheme (MCS) index, a code rate, a number of physical resource blocks, a device type, a channel type, and a transmission direction.

The preset parameters corresponding to the information bit sequence, the MCS index, the code rate, and the number of physical resource blocks are a first preset threshold, a second preset threshold, a third preset threshold, and a fourth preset threshold, respectively.

The preset parameter corresponding to the device type is a first type and a second type.

For example, the first type may be a base station and the second type may be a UE. Alternatively, the first type is an Enhanced Mobile Broadband (eMBB) device, and the second type is a Ultra Reliable Low Latency Communication (URLLC) device or a massive machine type of communication (mMTC) device, etc.

The preset parameter corresponding to the channel type is a control channel and a data channel. The control channel may include at least one of: a physical downlink control channel (PDCCH) and a physical broadcast channel (PBCH).

The preset parameter corresponding to the transmission direction is a downlink direction and an uplink direction. $N_0$ is determined by the transmitting node according to the data characteristic for representing the information bit sequence to be transmitted and the preset parameter corresponding to the data characteristic in the following manner:

$N_0$ is set to different values by the transmitting node according to different data characteristics, and different relationships between the data characteristics and the preset parameters.

Optionally, the data characteristic is the information bit sequence length and the preset parameter is the first preset threshold. The step in which the transmitting node determines the code block length $N_0$ for encoding the information bit sequence to be transmitted according to the data characteristic for representing the information bit sequence to be transmitted and the preset parameter corresponding to the data characteristic includes steps described below.

In condition that the length of the information bit sequence to be transmitted is not greater than the first preset threshold, the code block length $N_0$ is determined to be a first value. In condition that the length of the information bit sequence to be transmitted is greater than the first preset threshold, the code block length $N_0$ is determined to be a second value. The second value is greater than or equal to the first value.

Optionally, the data characteristic is the MCS index and the preset parameter is the second preset threshold. The step in which the transmitting node determines the code block length $N_0$ for encoding the information bit sequence to be transmitted according to the data characteristic for representing the information bit sequence to be transmitted and the preset parameter corresponding to the data characteristic includes steps described below.

In condition that the MCS index of the information bit sequence to be transmitted is not greater than the second preset threshold, the code block length $N_0$ is determined to be a third value. In condition that the MCS index of the information bit sequence to be transmitted is greater than the second preset threshold, the code block length $N_0$ is determined to be a fourth value. The fourth value is greater than the third value.

Optionally, the data characteristic is the code rate and the preset parameter is the third preset threshold. The step in which the transmitting node determines the code block length $N_0$ for encoding the information bit sequence to be transmitted according to the data characteristic for representing the information bit sequence to be transmitted and the preset parameter corresponding to the data characteristic includes steps described below.

In condition that the code rate of the information bit sequence to be transmitted is not greater than the third preset threshold, the code block length $N_0$ is determined to be a fifth value. In condition that the code rate of the information bit sequence to be transmitted is greater than the third preset threshold, the code block length $N_0$ is determined to be a sixth value. The sixth value is greater than the fifth value.

Optionally, the third preset threshold is greater than a minimum code rate of the information bit sequence to be transmitted, and the third preset threshold is a positive number less than 1.

Optionally, the data characteristic is the number of physical resource blocks and the preset parameter is the fourth preset threshold. The step in which the transmitting node determines the code block length $N_0$ for encoding the information bit sequence to be transmitted according to the data characteristic for representing the information bit sequence to be transmitted and the preset parameter corresponding to the data characteristic includes steps described below.

In condition that the number of physical resource blocks of the information bit sequence to be transmitted is not greater than the fourth preset threshold, the code block length $N_0$ is determined to be a seventh value. In condition that the number of physical resource blocks of the information bit sequence to be transmitted is greater than the fourth preset threshold, the code block length $N_0$ is determined to be an eighth value. The eighth value is greater than the seventh value.

Optionally, the data characteristic is the device type and the preset parameter includes the first type and the second type. The step in which the transmitting node determines the code block length $N_0$ for encoding the information bit sequence to be transmitted according to the data characteristic for representing the information bit sequence to be transmitted and the preset parameter corresponding to the data characteristic includes steps described below.

When the device type corresponding to the information bit sequence to be transmitted is the first type, the code block length $N_0$ is determined to be a ninth value. When the device type corresponding to the information bit sequence to be transmitted is the second type, the code block length $N_0$ is determined to be a tenth value. The tenth value is greater than the ninth value.

Optionally, the data characteristic is the channel type carrying the information bit sequence to be transmitted, and the preset parameter includes the control channel and the data channel. The step in which the transmitting node determines the code block length $N_0$ for encoding the information bit sequence to be transmitted according to the data characteristic for representing the information bit sequence to be transmitted and the preset parameter corresponding to the data characteristic includes steps described below.

When the channel type carrying the information bit sequence to be transmitted is the control channel, the code block length $N_0$ is determined to be a first preset value, that is, an eleventh value. When the channel type carrying the information bit sequence to be transmitted is the data channel, the code block length $N_0$ is determined to be a second preset value, that is, a twelfth value. The twelfth value is greater than the eleventh value.

Optionally, the data characteristic is the link direction of a data block, and the preset parameter includes the downlink direction and the uplink direction. The step in which the transmitting node determines the code block length $N_0$ for encoding the information bit sequence to be transmitted according to the data characteristic for representing the information bit sequence to be transmitted and the preset parameter corresponding to the data characteristic includes steps described below.

When the link direction of the information bit sequence to be transmitted is the uplink direction from a terminal to the base station or from the terminal to a relay, the code block length $N_0$ is determined to be a third preset value, that is, a thirteenth value. When the link direction of the information bit sequence to be transmitted is the downlink direction from the base station to the terminal or from the relay to the terminal, the code block length $N_0$ is determined to be a fourth preset value, that is, a fourteenth value. The fourteenth value may greater than the thirteenth value.

The downlink direction may be at least one of the PDCCH and the PBCH, and the uplink direction may be a physical uplink control channel (PUCCH). When the link direction is at least one of the PDCCH and PBCH, $N_0$ may be the maximum value allowed to be used in the downlink direction of the mother code block for the polar encoding, for example, $N_0$ is 512. When the link direction is the PUCCH, $N_0$ may be the maximum value allowed to be used in the uplink direction of the mother code block for the polar encoding, for example, $N_0$ is 1024.

The code block length $N_0$ is a maximum mother code length allowed to be used for performing the polar encoding on the information bit sequence to be transmitted.

Optionally, the step in which the transmitting node performs the polar encoding on the information bit sequence to be transmitted according to the code block length $N_0$ includes steps described below. When the code block number is C=1, the transmitting node concatenates K information bits with $N_0$−K frozen bits to generate an $N_0$-bit information bit vector, performs encoding on the $N_0$-bit information bit vector through a polar code encoder with an $N_0 \times N_0$ generation matrix to generate a code block with a length of $N_0$ bits, and selects M bits from the code block with $N_0$ bits to obtain a code block with a length of M bits; where K is the length of the information bit sequence to be transmitted.

Optionally, the step in which the transmitting node performs the polar encoding on the information bit sequence to be transmitted according to the code block length $N_0$ includes steps described below. In condition that the code block number is C=1 and $N_1 = 2^{\lceil log2(M) \rceil} \leq N_0$, the transmitting node maps K information bits onto bit channels, concatenates the K information bits with $N_1$−K frozen bits to generate an $N_1$-bit information bit vector, performs encoding on the $N_1$-bit information bit vector through the polar code encoder with an $N_1 \times N_1$ generation matrix to generate a code block with a length of $N_1$ bits, and selects the M bits from the code block with $N_1$ bits to obtain the code block with the length of M bits; where K is the length of the information bit sequence to be transmitted, and $N_1$ is a practical code block length generated by performing the polar encoding on the information bit sequence to be transmitted.

Optionally, the step in which the transmitting node performs the polar encoding on the information bit sequence to be transmitted according to the code block length $N_0$ includes steps described below. In condition that the code block number is C=1 and $N_1 = 2^{\lceil log2(M) \rceil} > N_0$, the transmitting node inputs the information bit sequence of length K and the $N_0$−K frozen bits to an $N_0 \times N_0$ polar code encoder for the polar encoding to obtain a code block with a length of $N_0$ bits, selects A bits from the code block with the length of $N_0$ bits to be added to an end of the code block with the length of $N_0$ bits to obtain a code block with a length of $N_0+\Delta$ bits, and selects the M bits from the code block with $N_0+\Delta$ bits to obtain the code block with the length of M bits; where $N_1$ is the practical code block length generated by performing the polar encoding on the information bit sequence to be transmitted, $\Delta$ is the fixed increment, and $\Delta$ is not greater than $N_0$.

In this optional solution, the practical code block length generated through the polar encoding is $N_1$, which is less than or equal to the code block length $N_0$ predetermined by the transmitting node.

Optionally, the frozen bits further include one or more check bits which are obtained by performing an XOR operation on the information bits.

Optionally, the step in which the transmitting node performs the polar encoding on the information bit sequence to be transmitted and obtains the C code blocks may further include steps described below.

The transmitting node repeats n bits in the information bit sequence $x_1^K = x_1, x_2, \ldots x_K$ to be transmitted for r times to obtain a new bit sequence having a length of K−n+n*r bits, and combines the new bit sequence and the frozen bits for the polar encoding to obtain a code block.

The method may further include that the transmitting node notifies the receiving node of a repetition manner.

Optionally, the step in which the transmitting node repeats the n bits in the information bit sequence to be transmitted includes a step described below.

The transmitting node repeats each of the first n consecutive bits in the information bit sequence to be transmitted for r times.

In the above description, n is an integer in a range from 1 to K including 1 and K, and r is a positive integer greater than or equal to 2, and n and r satisfy $$\frac{K + n*(r-1)}{N_0} < 1.$$

Optionally, the transmitting node repeats each of the first n consecutive bits in the information bit sequence to be transmitted for r times includes a step described below.

The transmitting node repeats a first bit or an intermediate bit in the information bit sequence to be transmitted for $K_0$−K+1 times, where $K_0 = * \lfloor N_0 * R \rfloor$ and R is a code rate.

Optionally, the step in which the transmitting node repeats each of the n bits in the information bit sequence to be transmitted include a step described below.

One or more inconsecutive bits selected from the information bit sequence to be transmitted are repeated for r times.

In the above description, n is an integer in a range from 1 to K including 1 and K, r is a positive integer greater than or equal to 2, and n and r satisfy $$\frac{K + n*(r-1)}{N_0} < 1.$$

Optionally, the step in which the transmitting node repeats each of the n bits in the information bit sequence to be transmitted include steps described below.

The transmitting node maps each bit in the information bit sequence to be transmitted before repeating the n bits for r times to an information bit channel to transmit, and transmits bits obtained by repeating the n bits selected from the information bit sequence to be transmitted for r times by using the frozen bit channels, or maps the new bit sequence bit by bit onto K+n*(r−1) bit channels with highest reliability, where the selected n bits are the first n consecutive bits in the information bit sequence to be transmitted, or n inconsecutive bits in the information bit sequence to be transmitted.

In this embodiment, repeating one bit for r times means making the one bit appear r times, that is, the one bit is increased by r−1 times. For example, if only the first bit in the information bit sequence $x_1^K = x_1, x_2, \ldots x_K$ is repeated twice, the new bit sequence obtained is $x_1^{K+1} = x_1, x_1, x_2 \ldots x_K$.

Optionally, the selected bits have essential influence on decoding performance of the information bit sequence to be transmitted. The selected bits may be a leading bit and an intermediate bit in the information bit sequence to be transmitted, for example, the first bit and a K/2-th bit of the information bit sequence.

Optionally, the step in which the transmitting node processes the information bit sequence to be transmitted to obtain the C code blocks includes steps described below.

If the first segmentation condition and/or the second segmentation condition are satisfied, and the code block number is C>1, the transmitting node divides the information bit sequence to be transmitted into C vector segments, performs the polar encoding on each of the C vector segments to obtain a code block of length $C*N_0$, and selects the M bits from the code block of length $C*N_0$ to obtain the code block with the length of M bits.

The information bit sequence to be transmitted may be further equally divided according to M. A corresponding number of bits are respectively selected from the C vector segments for the polar encoding to obtain a code block having a length of $$\frac{M}{C}$$

bits, and the C code blocks each with the length of $$\frac{M}{C}$$

bits are concatenated to obtain the code block with the length of M bits. M is related to a resource configured for the transmitting node.

Optionally, the step in which the transmitting node divides the information bit sequence to be transmitted into the C vector segments include a step described below.

The transmitting node equally divides the information bit sequence to be transmitted into C sub-information bit sequences.

For example, the transmitting node may equally divide the information bit sequence to be transmitted into the C sub-information bit sequences by dividing the information bit sequence into sub-information bit sequences of length $$\left\lceil \frac{K}{C} \right\rceil,$$

where $\lceil \cdot \rceil$ represents rounding up.

Furthermore, the C sub-information bit sequences may include C1 sub-information bit sequences of length $$\left\lfloor \frac{K}{C} \right\rfloor$$

and C2 sub-information bit sequences of length $$\left\lfloor \frac{K}{C} \right\rfloor + 1,$$

where $$C1 = K - \left\lceil \frac{K}{C} \right\rceil * C,$$

and C2=C−C1.

Optionally, the step in which the transmitting node divides the information bit sequence to be transmitted into the C vector segments include a step described below.

The transmitting node selects C−1 vector segments of length $K_0$ from the information bit sequence to be transmitted, where $K_0 = \lfloor N_0 * R \rfloor$, and taking remaining bits in the information bit sequence to be transmitted as a C-th vector segment.

Optionally, the step in which the transmitting node concatenates the C code blocks includes one of steps described below.

Each of the C code blocks are interleaved and connected end to end; or the C code blocks are interleaved after the C code blocks are connected end to end or interlaced.

Each of the C code blocks is configured as an information bit sequence, and Reed-Muller (RM) encoding or the polar encoding or packet encoding is performed on the information bit sequence.

Optionally, before the transmitting node processes the information bit sequence to be transmitted to obtain the C code blocks, the method further includes steps described below.

The transmitting node performs cyclic redundancy check (CRC) encoding on the information bit sequence to be transmitted, and divides the CRC encoded information bit sequence into segments.

Alternatively, the transmitting node dividing the information bit sequence to be transmitted into C information bit sequences and performs the CRC encoding on each of the C information bit sequences.

In this embodiment, the length of the information bit sequence to be transmitted is denoted as K (K is a positive integer and $K \leq N_0$), the code rate is denoted as R (R is a positive number not greater than 1), and thus $$N = \left\lceil \frac{K}{R} \right\rceil,$$

where $\lceil \cdot \rceil$ represents rounding up. The polar encoding may be performed by inputting the information bit sequence to be transmitted into the polar code encoder.

In this embodiment, $N_0$ is the predetermined code block length, but the practical code block length obtained through the polar encoding may be $N_0$ or $N_1$. The M bits may be selected from the code block with $N_0$ or $N_1$ bits to obtain the code block with the length of M bits.

The bit may be repeated whether C=1 or C>1. In the case where C>1 and the information bit sequence needs to divided into segments, each vector segment may be processed in the same manner as that in the case where C=1, for example, the code block of length $N_0$ or $N_1$ may be obtained.

A polar encoding process is introduced below by taking the code block of length No as an example. Assuming that the information bit sequence is transmitted, $$F = \begin{bmatrix} 1 & 0 \\ 1 & 1 \end{bmatrix},$$

the generation matrix of a polar code is $G_{n0}=F^{\otimes n0}$, where $\otimes$ denotes a kronecker power, F is the Arikan kernel, $n_0$ is a positive integer, and $n_0=\log_2 N_0$.

Each row of the generation matrix may be referred to as a bit channel. According to reliability indicators of the bit channel, the transmitting node may select the most reliable K rows (i.e., K rows with the highest reliability) from the generation matrix as information bit channels, and a set of information bit channels is denoted as A. The remaining rows of the generation matrix are frozen bit channels, and a set of frozen bit channels is denoted as. The reliability indicators may include a Bhattacharyya parameter, a bit error rate, a channel capacity, and the like. When the length K and/or the code rate R of the information bit sequence to be transmitted change, the code block length may be adjusted by means of segmentation, dynamic adjustment of the information bit channels and the frozen bit channels, and the like.

In the encoding process, the bit sequence to be encoded is bit reversed to obtain a bit reversal sequence, and then the bit reversal sequence is multiplied by the generation matrix $G_{N_0}$ to obtain the corresponding codeword sequence (code block). The bit reversal sequence may be denoted as $B_n$. Assuming that the bit sequence to be encoded is $u_1^4=u_1, u_2, u_3, u_4$, the bit reversal sequence is $u'_1{}^4=u'_1, u'_2, u'_3, u'_4$. A decoder performs decoding after acquiring information about A and $u_{A^c}$. The information about A and $u_{A^c}$ includes, but is not limited to, indexes of the bit channels.

Figure 2:
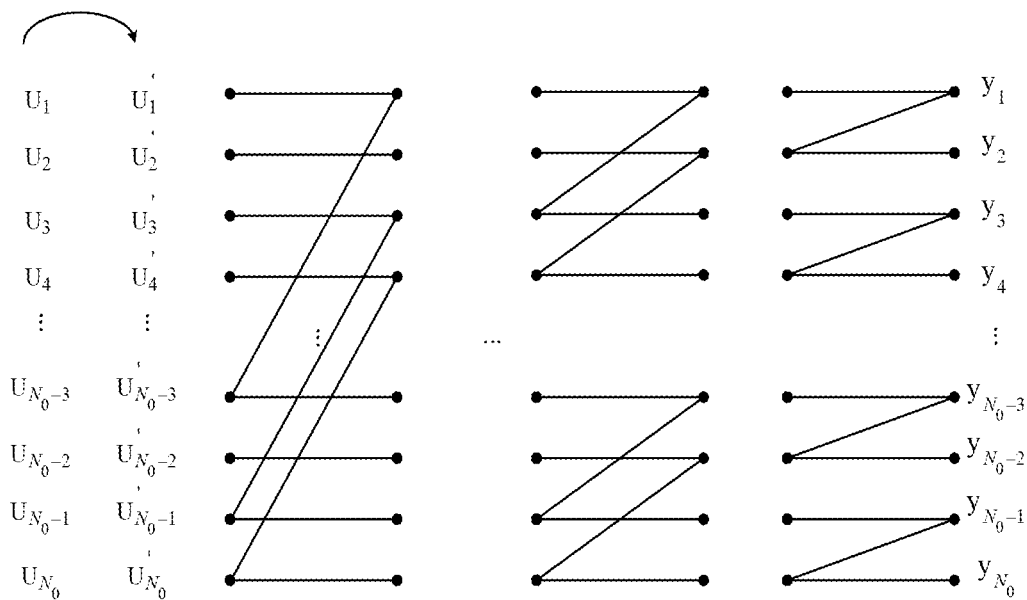
FIG. 2 is a schematic diagram of a polar code encoder according to an embodiment of the present disclosure.

The encoding process is shown in FIG. 2, and may be expressed by a mathematical formula as: $Y_1^{N_0}=B_{N_0}U_1^{N_0}G_{N_0}$, $u_1^{N_0}=u_1, u_2, \ldots u_{N_0}, u'_1{}^{N_0}=B_{N_0}u_1^{N_0}$.

$u'_1{}^{N_0}=u'_1, u'_2, \ldots u'_{N_0}$ is the bit reversal sequence. $y_1^{N_0}=y_1, y_2, \ldots y_{N_0}$ is the obtained codeword sequence, that is, the code block.

Optionally, a process in which the transmitting node processes the information bit sequence to be transmitted to obtain the code block is described below.

The code block number C is calculated $$C = \left\lceil \frac{N}{N_0} \right\rceil.$$

In condition that the code block number is C=1, segmentation is not performed. In condition that the code block number is C>1, the information bit sequence to be transmitted may be divided into the C vector segments, and each of the C vector segments may be encoded to obtain the code block.

In condition that the code block number is C=1, the transmitting node may repeatedly encode some bits in the information bit sequence and notify the receiving node of repetition information. The repletion manner may be repeatedly encoding each of consecutive bits, or may also be repeatedly encoding each of inconsecutive bits. According to the new bit sequence obtained after repeatedly encoding some bits, the polar encoding is performed to obtain the code block (codeword sequence).

The transmitting node may configure information about the information bit channels, information about the frozen bit channels, information about the check bits, and the like for the receiving node, where the information about the information bit channels includes, but is not limited to, channel indexes.

At the receiving node, the decoder may combine likelihood ratio information in the code block to be decoded according to the repetition information transmitted by the transmitting node, thereby reducing a decoding error rate and avoiding chain reactions of a decoding error.

Figure 3:
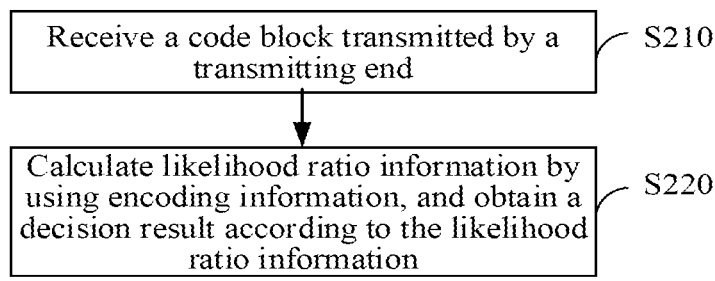
FIG. 3 is a flowchart of another data processing method according to an embodiment of the present disclosure.

FIG. 3 shows another data processing method provided in this embodiment. As shown in FIG. 3, the method may include steps 210 to 220.

In step 210, a code block and encoding information of the code block transmitted by a transmitting node are received. The code block is obtained by performing polar encoding by the transmitting node on an information bit sequence to be transmitted according to a code block length $N_0$. The code block length $N_0$ is determined by the transmitting node according to a data characteristic for representing the information bit sequence to be transmitted and a preset parameter corresponding to the data characteristic.

In step 220, likelihood ratio information is calculated by using the encoding information, and a decision result is obtained according to the likelihood ratio information.

Optionally, $N_0$ may be set according to scenarios which may include a link direction or different types of channels. For example, one value is set for an UL channel, one value is set for a DL control channel, and one value is set for a DL traffic channel.

Optionally, the data characteristic includes one or more of: an information bit sequence length, an MCS index, a code rate, a number of physical resource blocks, a device type, a channel type, and a transmission direction.

The preset parameters corresponding to the information bit sequence, the MCS index, the code rate, and the number of physical resource blocks are a first preset threshold, a second preset threshold, a third preset threshold, and a fourth preset threshold, respectively.

The preset parameter corresponding to the device type is a first type and a second type.

The preset parameter corresponding to the channel type is a control channel and a data channel.

The preset parameter corresponding to the transmission direction is a downlink direction and an uplink direction.

The step in which $N_0$ is determined by the transmitting node according to the data characteristic for representing the information bit sequence to be transmitted and the preset parameter corresponding to the data characteristic includes that $N_0$ is set to different values by the transmitting node according to different data characteristics and/or different relationships between the data characteristics and the preset parameters. A manner for determining $N_0$ may be referred to the embodiment described above. Optionally, the method further includes: receiving the encoding information of the code block transmitted by the transmitting node.

The encoding information includes one or more of: the code block length, a code block number C, information about information bit channels, information about frozen bit channels, or repetition information.

The repetition information may include whether a bit in the information bit sequence is repeated, a repetition manner when the bit in the information bit sequence is repeated, and the like.

Optionally, the step in which the likelihood ratio information is calculated by using the encoding information may include a step described below.

The likelihood ratio information is calculated according to the following formula:

$$L_N^i(y_1^N, \hat{u}_1^{i-1}) = \frac{W_N^i(y_1^N, \hat{u}_1^{i-1}|0)}{W_N^i(y_1^N, \hat{u}_1^{i-1}|1)}$$

In the above formula, $W_N^i(y_1^N, \hat{u}_1^{i-1}|0)$ denotes a probability that a current bit is decided to be 0 according to a previously estimated information bit sequence $\hat{u}_1^{i-1}$, $W_N^i(y_1^N, \hat{u}_1^{i-1}|1)$ denotes a probability that the current bit is decided to be 1 according to the previously estimated information bit sequence $\hat{u}_1^{i-1}$, i is an index of the bit channel, and $1 \leq i \leq N$.

The decision result is obtained according to the likelihood ratio information by the following formula:

$$\hat{u}_i = \begin{cases} 0, & L_N^i(y_1^N, \hat{u}_1^{i-1}) \geq 1 \\ 1, & \text{otherwise} \end{cases}.$$

If it is determined that a signal transmitted by the transmitting node is repeated according to the encoding information, the likelihood ratio information of the corresponding bit channels is combined according to the repetition information, and the decision result is obtained according to the combined likelihood ratio information.

Optionally, the step in which the decision result is obtained according to the combined likelihood ratio information further includes a step described below.

If the decision result obtained according to the combined likelihood ratio information is inconsistent with the decision result before combination, the decision result before the combination is reversed.

Furthermore, according to the other decision results obtained before the decision result is obtained according to the combined likelihood ratio information and the decision result which is reversed to make a second decision.

Optionally, after the decision result is obtained according to the likelihood ratio information, the method further includes: performing decoding according to the information about the information bit channels and the information about the frozen bit channels.

Optionally, the encoding information further includes concatenation information. The code block is C code blocks concatenated.

After the decision result is obtained according to the likelihood ratio information, the method further includes: if the code block number is C>1, de-concatenating the code block according to the concatenation information to obtain the C code blocks and decoding each of the C code blocks according to the information about the information bit channels and the information about the frozen bit channels.

Optionally, the step of de-concatenating the code block according to the concatenation information to obtain the C code blocks includes a step described below.

De-interleaving or decoding is performed according to the concatenation information to obtain the C code blocks. The decoding includes any one of: RM decoding, polar decoding, and packet decoding. Optionally, the data processing method further includes a step described below.

Paths are clipped according to the information about the check bits or a CRC encoding result to reserve likelihood ratios of L paths.

The embodiments described above will be described below through six implementation examples. An example in which a practical code block outputted by a polar code encoder has a length of $N_0$ is used for describing the implementation examples below.

Implementation Example 1

In this example, a data processing process of a transmitting node includes steps 102 to 106.

In step 102, the transmitting node calculates $$N = \left\lceil \frac{K}{R} \right\rceil$$

according to a length K (a number of bits) of an information bit sequence to be transmitted and a code rate R. The transmitting node calculates a number $$C = \left\lceil \frac{N}{N_0} \right\rceil$$

of code blocks to be encoded according to N and a predetermined code block length $N_0$, where N is a practical code block length required by the information bit sequence to be transmitted.

In this example, it is assumed that N is less than or equal to $N_0$, that is, C=1.

In step 104, the transmitting node selects the first n (n is a positive integer, and $1 \leq n \leq K$) bits from the information bit sequence to be transmitted to repeatedly encode for r times (r is a positive integer greater than or equal to 2) to obtain a new bit sequence.

Figure 4:
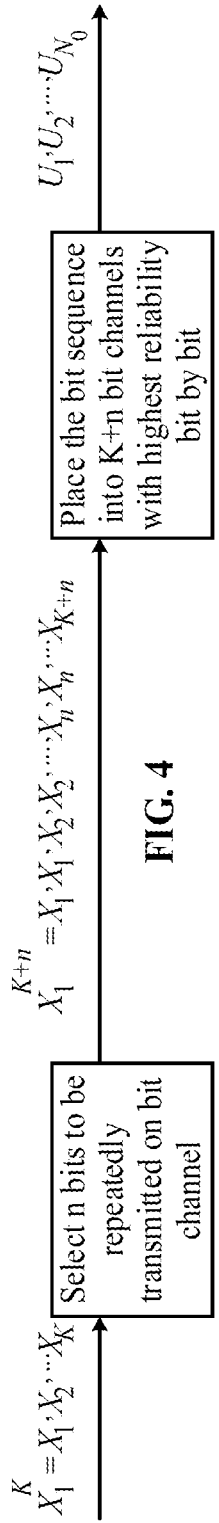
FIG. 4 is a schematic diagram of a data processing process according to an embodiment of the present disclosure.

A repeated encoding process is shown in FIG. 4 (r=2). The first n consecutive bits are selected from the information bit sequence for repeated transmission on bit channels, that is, each of the n consecutive bits is repeated to obtain the new bit sequence $\varkappa_1^{K+n} = \varkappa_1, \varkappa_1, \varkappa_2, \varkappa_2, \ldots, \varkappa_n, \varkappa_n, \ldots, \varkappa_{K+n}$.

The new bit sequence is mapped bit by bit onto K+n bit channels with the highest reliability among $N_0$ bit channels to obtain $u_1^{N_0} = u_1, u_2, \ldots u_{N_0}$.

In particular, when n=0, the repeated encoding is not performed, and when n=K, the entire information bit sequence is repeatedly encoded.

An encoder selects K+n*(r-1) best bit channels as information bit channels (a set of information bit channels is denoted as A) for transmitting an encoded vector after the information bit sequence to be transmitted is repeatedly encoded. The encoder also notifies a receiving node of information about n and A (such as index information). For example, $$\frac{K + n * (r-1)}{N_0} < 1.$$

One or more bits are selected from frozen bit channels as check bits to perform check encoding on bits in the information bit sequence to be transmitted.

In step 106, $u_1^{N_0} = u_1, u_2, \ldots u_{N_0}$ is bit reversed and inputted into a polar code encoder to obtain a codeword sequence $y_1^{N_0} = y_1, y_2, \ldots y_{N_0}$.

After receiving the codeword sequence and encoding information of the codeword sequence from the transmitting node, the receiving node decodes the codeword sequence. In a decoding process, r consecutive pieces of likelihood ratio information may be combined to obtain decision decoding of corresponding bits. In the decoding process, the receiving node reserves likelihood ratios of L paths. An estimate of a bit in the information bit sequence corresponding to each path is checked with reference to information about the check bits; a path is clipped if the check fails; and the path is reserved if the check succeeds.

Implementation Example 2

In this example, a data processing process of a transmitting node includes steps 202 to 206.

In step 202, the transmitting node calculates $$N = \left\lceil \frac{K}{R} \right\rceil$$

according to a length K (a number of bits) of an information bit sequence and an code rate R. The transmitting node calculates a number $$C = \left\lceil \frac{N}{N_0} \right\rceil$$

of code blocks to be encoded according to a practical code block length N required by the information bit sequence to be transmitted and a predetermined code block length $N_0$.

In this example, it is assumed that N is less than or equal to $N_0$, that is, C=1.

Figure 5:
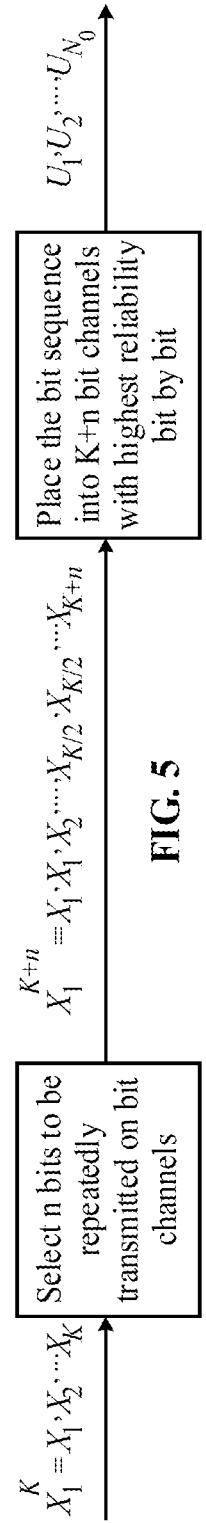
FIG. 5 is a schematic diagram of another data processing process according to an embodiment of the present disclosure.

In step 204, the transmitting node selects n (n is a positive integer, and 1≤n≤K) bits from the information bit sequence $x_1^K = x_1, x_2, \ldots, x_K$ to be transmitted to repeatedly encode for r times (r may be a positive integer greater than or equal to 2) and repeatedly transmit the n bits on bit channels. A repeated encoding process is shown in FIG. 5 (r=2). n bits are selected from the information bit sequence for repeated transmission on the bit channels, that is, each of the n bits is repeated. Indexes of the selected n bits may be non-adjacent. For example, if a first bit and a K/2-th bit are selected and repeated, n=2 and a new bit sequence obtained is $x_1^{K+2} = x_1, x_1, x_2, \ldots, x_{K/2}, x_{K/2}, \ldots, x_K$.

The new bit sequence is mapped bit by bit onto K+n bit channels with the highest reliability among $N_0$ bit channels to obtain $u_1^{N_0} = u_1, u_2, \ldots u_{N_0}$.

An encoder selects K+n*(r−1) best bit channels (denoted as A) from a generation matrix for transmitting the repeatedly encoded information bit sequence. The encoder also notifies a receiving node of information about n and A (such as index information). For example, $$\frac{K + n*(r-1)}{N_0} < 1.$$

In step 206, $u_1^{N_0} = u_1, u_2, \ldots u_{N_0}$ is bit reversed and inputted into a polar code encoder to obtain a codeword sequence $y_1^{N_0} = y_1, y_2, \ldots y_{N_0}$.

After receiving the codeword sequence and encoding information of the codeword sequence from the transmitting node, the receiving node decodes the codeword sequence. In a decoding process, P consecutive pieces of likelihood ratio information may be combined to obtain decision decoding of the bit.

In the decoding process, the receiving node reserves likelihood ratios of L paths. An estimate of a bit in the information bit sequence corresponding to each path is checked with reference to information about check bits; a path is clipped if the check fails; and the path is reserved if the check succeeds.

Implementation Example 3

In this example, a data processing process of a transmitting node includes steps 302 to 306.

In step 302, the transmitting node calculates $$N = \left\lceil \frac{K}{R} \right\rceil$$

according to a length K of an information bit sequence and an code rate R. The transmitting node calculates a number $$C = \left\lceil \frac{N}{N_0} \right\rceil$$

of code blocks according to a practical code block length N required by the information bit sequence to be transmitted and a predetermined code block length $N_0$.

In step 304, if C=1, the transmitting node selects n (n is a positive integer, and 1≤n≤K; and n may also be 0 to indicate that no bit is repeated) bits from the information bit sequence $x_1^K = x_1, x_2, \ldots x_K$ to be transmitted to repeatedly encode the n bits for P times (P is a positive integer greater than 1) and repeatedly transmit the n bits on bit channels. For example, $$\frac{K + n*(P-1)}{N_0} < 1.$$

Based on implementation example 1 and implementation example 2, indexes of the selected n bits may be adjacent and or non-adjacent. Different from implementation example 1 and implementation example 2, the bits to be repeatedly transmitted in the information bit sequence may be transmitted on bit channels with reliability lower than those of K bit channels, that is, on a (K+1)-th bit channel to a (K+n)-th bit channel after the bit channels are ranked in a descending order of reliability.

Figure 6:
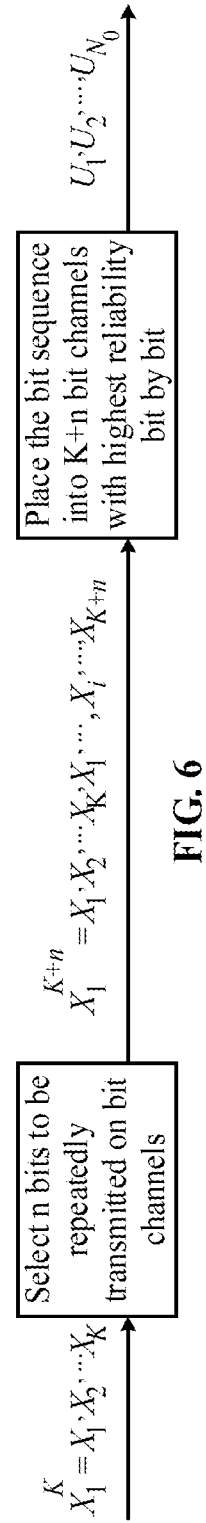
FIG. 6 is a schematic diagram of another data processing process according to an embodiment of the present disclosure.

A repeated encoding process is shown in FIG. 6 (P=2). n bits are selected from the information bit sequence to be transmitted for repeated transmission on the bit channels, that is, each of the n bits is repeated. The indexes of the selected n bits may be non-adjacent. For example, if a first bit and a K/2-th bit are selected and repeated, a new bit sequence obtained is $x_1^{K+2} = x_1, x_2, \ldots, x_{K/2}, \ldots, x_K, x_1', x_{K/2}'$.

The new bit sequence is mapped bit by bit onto the (K+1)-th bit channel to the (K+n)-th bit channel with relatively high reliability among $N_0$ bit channels to obtain $u_1^{N_0} = u_1, u_2, \ldots u_{N_0}$.

One or more bits are selected from frozen bit channels as check bits to perform check encoding on bits in the information bit sequence.

In step 306, $u_1^{N_0} = u_1, u_2, u_{N_0}$ is bit reversed and inputted into a polar code encoder to obtain a codeword sequence $y_1^{N_0} = y_1, y_2, \ldots y_{N_0}$.

After receiving the codeword sequence and encoding information of the codeword sequence from the transmitting node, the receiving node decodes the codeword sequence. In a decoding process, P consecutive pieces of likelihood ratio information may be combined to obtain decision decoding of corresponding bits.

In the decoding process, the receiving node reserves likelihood ratios of L paths. An estimate of a bit in the information bit sequence corresponding to each path is checked with reference to information about check bits; a path is clipped if the check fails; and the path is reserved if the check succeeds.

Implementation Example 4

In this example, a data processing process of a transmitting node includes steps 402 to 406.

In step 402, the transmitting node calculates $$N = \left\lceil \frac{K}{R} \right\rceil$$

according to a length K (a number of bits) of an information bit sequence to be transmitted and an code rate R. The transmitting node calculates a number $$C = \left\lceil \frac{N}{N_0} \right\rceil$$

of code blocks to be encoded according to N and a predetermined code block length $N_0$.

In this example, it is assumed that N is greater than $N_0$, that is, C>1, segments of the information bit sequence are encoded, and the encoded segments are concatenated.

In step 402, the transmitting node divides the information bit sequence $x_1^K = x_1, x_2, \ldots x_K$ into multiple vector segments. A segmentation process is described below.

In step 1, a length of the vector segment is calculated according to the code rate R and the predetermined code block length $N_0$: $K_0 = \lfloor N_0 * R \rfloor$.

In step 2, a length of each code block obtained by encoding the first C−1 vector segments of the C code blocks is $N_0$, and a length of a code block obtained by encoding the last vector segment is $N - N_0*(C-1)$. Therefore, a length of the last vector segment is $K - K0*(C-1)$.

Optionally, for the vector segment of length K0, K0 most reliable channels are selected according to channel reliability as information bit channels, and the remaining bit channels are frozen bit channels.

Optionally, one or more bit channels may be selected from the frozen bit channels as some pre-agreed bits in the vectors (for example, two channels are selected from the frozen bit channels, one of which is set to $u_0$, and the other one is set to $u_{K_0/2}$). The vector segments are respectively inputted into a polar code encoder to be encoded.

For the last vector segment, if the length of the corresponding code block is less than $N_0$, n bits in the last vector segment may be repeated in the manner shown in implementation example 1, implementation example 2, or implementation example 3.

One or more bits are selected from the frozen bit channels as check bits to perform check encoding on bits in the information bit sequence. The selected check bits may also be used for checking bits in the information bit sequence corresponding to the last code block.

In step 406, bit sequences obtained by encoding each vector segment are bit reversed and inputted into the polar code encoder. The outputted results of the encoder are concatenated or encoded using an external code (such as packet encoding, RM encoding, or polar encoding) to obtain a codeword sequence $y_1 = y_1, y_2, \ldots y_{N_0}$. In addition, the transmitting node may also notify a receiving node of information such as information about the information bit channels, information about the frozen bit channels, and an encoding scheme (for example, whether a bit is repeatedly encoded, and which frozen bit channels are used for transmitting the bits in the information bit sequence).

The transmitting node may also interleave multiple code blocks obtained through the polar encoding, and then concatenate the multiple code blocks.

Figure 7:
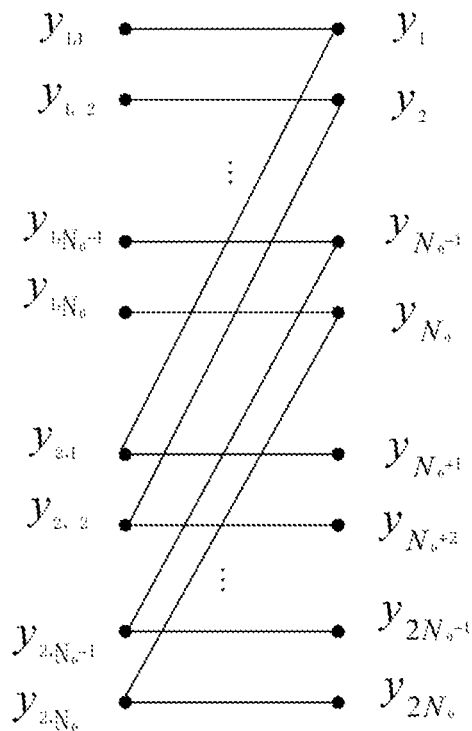
FIG. 7 is a schematic diagram of secondary polar encoding according to an embodiment of the present disclosure.

The transmitting node may also take the multiple code blocks obtained through the polar encoding as information bit sequences to perform the polar encoding on the information bit sequences, as shown in FIG. 7, the polar encoding is performed twice.

After receiving the codeword sequence and encoding information corresponding to the codeword sequence from the transmitting node, the receiving node decodes the codeword sequence. In a decoding process, the decoding is performed according to the obtained information about the encoding scheme. If the repeated encoding is not performed, the decoding is performed according to conventional successive cancellation (SC) or a successive cancellation list (SCL). If the repeated encoding is performed, necessary combination is performed according to the repeated encoding information to obtain a final decision output. If the transmitting node performs secondary polar encoding, as shown in FIG. 7, the code blocks obtained through the polar encoding are taken as the information bit sequences for the secondary polar encoding, the codeword sequence is first decoded to obtain the code blocks and then each of the code blocks is decoded in conjunction with check information.

Implementation Example 5

In this example, a signal processing process of a transmitting node includes steps 502 to 506.

In step 502, the transmitting node calculates $$N = \left\lceil \frac{K}{R} \right\rceil$$

according to a length K (a number of bits) of an information bit sequence to be transmitted and an code rate R. The transmitting node calculates a number $$C = \left\lceil \frac{N}{N_0} \right\rceil$$

of code blocks to be encoded according to N and a predetermined code block length $N_0$.

In this example, it is assumed that N is greater than $N_0$, that is, C>1, segments of the information bit sequence are encoded, and the encoded segments are concatenated.

In step 504, the transmitting node divides the information bit sequence $x_1^K = x_1, x_2, \ldots x_K$ into multiple vector segments. A segmentation process is described below.

The information bit sequence is divided into equal C parts, that is, each vector segment has an equal practical length. An effective length of each code block obtained by encoding each vector segment is $$N' = \frac{N}{C},$$

and a length of each vector segment is K'=N'*R.

If the length of the code block corresponding to each vector segment is less than $N_0$, n bits in the each vector segment may be repeated in the manner shown in implementation example 1, implementation example 2, or implementation example 3.

In step 506, bit sequences obtained by encoding each vector segment are bit reversed and inputted into a polar code encoder. The outputted results of the encoder are concatenated to obtain a codeword sequence $y_1^{N_0} = y_1, y_2, \ldots yN_0$.

In addition, the transmitting node notifies a receiving node of indexes of information bit channels, indexes of frozen bit channels, encoding information, and the like (for example, whether a bit is repeatedly encoded).

After receiving the codeword sequence and the encoding information corresponding to the codeword sequence from the transmitting node, the receiving node decodes the codeword sequence. If the repeated encoding is performed, the corresponding likelihood ratio information is combined, and then a codeword decision is made. If the transmitting node performs secondary polar encoding, the codeword sequence is first decoded to obtain the code blocks and then each of the code blocks is decoded in conjunction with check information.

Implementation Example 6

A transmitting node may perform CRC encoding on an information bit sequence to be transmitted and then divide the CRC encoded information bit sequence into segments (if necessary). Alternatively, the transmitting node may divide the information bit sequence to be transmitted into segments and then perform the CRC encoding on each segment of the information bit sequence (if C>1). The processing is performed based on the implementation examples 1 to 5 described above. The transmitting node may repeatedly transmit redundant bits after the CRC encoding.

After receiving a codeword sequence, a receiving node performs decoding according to encoding information. After the decoding, a decision output is performed on each path, and then CRC check is performed. A decision corresponding to a path checked to be correct is a final estimate of the information bit sequence. If all paths fail to be checked, the decoding fails and a Hybrid Automatic Repeat reQuest (HARD) may be performed.

Figure 8:
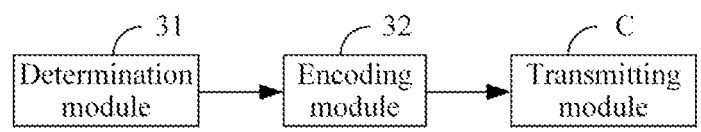
FIG. 8 is a structural diagram of a data processing apparatus according to an embodiment of the present disclosure.

This embodiment further provides a data processing apparatus. As shown in FIG. 8, the apparatus may include a determination module 31, an encoding module 32, and a transmitting module 33.

The determination module 31 is configured to determine a code block length $N_0$ for encoding an information bit sequence to be transmitted according to a data characteristic for representing the information bit sequence to be transmitted and a preset parameter corresponding to the data characteristic.

The encoding module 32 is configured to perform polar encoding on the information bit sequence to be transmitted according to the code block length $N_0$.

The transmitting module 33 is configured to transmit a code block obtained through the polar encoding to a receiving node.

Optionally, $N_0$ may be set according to scenarios which may include a link direction or different types of channels. For example, one value is set for an UL channel, one value is set for a DL control channel, and one value is set for a DL traffic channel.

Optionally, the data characteristic includes one or more of: an information bit sequence length, an MCS index, a code rate, a number of physical resource blocks, a device type, a channel type, and a transmission direction.

The preset parameters corresponding to the information bit sequence, the MCS index, the code rate, and the number of physical resource blocks are a first preset threshold, a second preset threshold, a third preset threshold, and a fourth preset threshold, respectively.

The preset parameter corresponding to the device type is a first type and a second type.

The preset parameter corresponding to the channel type is a control channel and a data channel.

The preset parameter corresponding to the transmission direction is a downlink direction and an uplink direction.

The determination module determines the code block length $N_0$ for encoding the information bit sequence according to the data characteristic for representing the information bit sequence to be transmitted and the preset parameter corresponding to the data characteristic in a manner described below.

$N_0$ is set to different values by a transmitting node according to different data characteristics, and different relationships between the data characteristics and the preset parameters.

A manner for determining $N_0$ may be referred to the embodiments described above.

Optionally, the encoding module is further configured to determine a code block number C according to the code block length $N_0$ before the transmitting node performs the polar encoding on the information bit sequence to be transmitted according to the code block length $N_0$. When N satisfies a first segmentation condition, $N \geq N_0 + A$, the transmitting node performs code block segmentation on the information bit sequence, that is, the code block number is $C \geq 2$; where N is a practical code block length required by the information bit sequence, and A is a fixed increment. When $N \leq N_0 + A$, the code block number is C=1, and the code block segmentation is not performed.

Optionally, the encoding module is further configured to determine the code block number C according to a length of the information bit sequence to be transmitted before the transmitting node performs the polar encoding on the information bit sequence to be transmitted according to the code block length $N_0$. When K satisfies a second segmentation condition, $K \geq K_{max}$, the transmitting node performs the code block segmentation on the information bit sequence, that is, $C \geq 2$. When $K < K_{max}$, the code block number is C=1, and the code block segmentation is not performed, where K is the length of the information bit sequence to be transmitted, and $K_{max}$ is a preset maximum information bit sequence length.

Optionally, the encoding module is further configured to determine the code block number C according to the code block length $N_0$:

$$C = \left\lceil \frac{N}{N_0} \right\rceil,$$

before the polar encoding is performed on the information bit sequence to be transmitted according to the code block length $N_0$, where N is the practical code block length required by the information bit sequence, and $\lceil \cdot \rceil$ represents rounding up. The encoding module processes the information bit sequence to be transmitted to obtain C code blocks.

Optionally, the encoding module performs the polar encoding on the information bit sequence to be transmitted according to the code block length $N_0$ in a manner described below.

When the code block number is C=1, the transmitting node concatenates K information bits with $N_0$–K frozen bits to generate an $N_0$-bit information bit vector, performs encoding on the $N_0$-bit information bit vector through a polar code encoder with an $N_0 \times N_0$ generation matrix to generate a code block with a length of $N_0$ bits, and selects M bits from the code block with $N_0$ bits to obtain a code block with a length of M bits; where K is the length of the information bit sequence to be transmitted.

Optionally, the encoding module performs the polar encoding on the information bit sequence to be transmitted according to the code block length $N_0$ to obtain the C code blocks in a manner described below.

When the code block number is C=1, and $N_1=2^{\lceil log_2(M) \rceil} \le N_0$, the transmitting node maps the K information bits onto information bit channels, concatenates the K information bits and $N_1$–K frozen bits to generate an $N_1$-bit information bit vector, performs encoding on the $N_1$-bit information bit vector through a polar code encoder with an $N_1 \times N_1$ generation matrix to generate a code block with a length of $N_1$ bits, and selects the M bits from the code block with $N_1$ bits to obtain the code block with the length of M bits; where K is the length of the information bit sequence to be transmitted, and $N_1$ is the practical code block length used for performing the polar encoding on the information bit sequence to be transmitted.

Optionally, the encoding module is further configured to: when the code block number is C=1, and $N_1=2^{\lceil log_2(M) \rceil} > N_0$, input the information bit sequence of length K and the $N_0$–K frozen bits into an $N_0 \times N_0$ polar code encoder for the polar encoding to obtain a code block with a length of $N_0$ bits, select A bits from the code block with the length of $N_0$ bits to be added to an end of the code block with the length of $N_0$ bits to obtain a code block with a length of $N_0+\Delta$ bits, and select the M bits from the code block with $N_0+\Delta$ bits to obtain the code block with the length of M bits; where $N_1$ is the practical code block length used for performing the polar encoding on the information bit sequence to be transmitted, and $\Delta$ is the fixed increment.

Optionally, the frozen bits further include one or more check bits which are obtained by performing an XOR operation on the information bits.

Optionally, the apparatus may further include a notification module, configured to notify the receiving node of information on the frozen bits, the information bits, and the check bits.

Optionally, the information bit sequence to be transmitted is an information bit sequence $x_1^K=x_1, x_2, \ldots x_K$ having a length K.

The encoding module is further configured to repeat n bits in the information bit sequence to be transmitted for r times to obtain a new bit sequence with a length of K−n+n*r bits, and combine the new bit sequence and the frozen bits for the polar encoding to obtain a code block, where K is the length of the information bit sequence to be transmitted, n is an integer from 1 to K with 1 and K included, and r is a positive integer greater than or equal to 2.

The notification module is configured to notify the receiving node of a repetition manner.

Optionally, the encoding module repeats the n bits in the information bit sequence to be transmitted for r times in a manner described below.

The transmitting node repeats first n consecutive bits in the information bit sequence to be transmitted for r times.

In the above description, n is an integer from 1 to K with 1 and K included, r is a positive integer greater than or equal to 2, and n and r satisfy $$\frac{K+n*(r-1)}{N_0} < 1$$

Optionally, the encoding module repeats the n consecutive bits in the information bit sequence for r times in a manner described below.

The transmitting node repeats a first bit or an intermediate bit in the information bit sequence for $K_0$–K+1 times, where $K_0=\lfloor N_0 *^R \rfloor$, n=1, r=$K_0$–K+1, and R is a code rate.

Optionally, the encoding module repeats the n bits in the information bit sequence for r times in a manner described below.

n inconsecutive bits are selected from the information bit sequence and repeated for r times, where, n is an integer from 1 to K with 1 and K included, r is a positive integer, r is greater than or equal to 2, and n and r satisfy $$\frac{K+n*(r-1)}{N_0} < 1.$$

Optionally, the encoding module is configured to repeat the first bit and a K/2-th bit selected from the information bit sequence to be transmitted for r times.

Optionally, after the encoding module repeats the n bits in the information bit sequence for r times, the encoding module further performs an operation described below.

The encoding module maps each bit in the information bit sequence to be transmitted before repeating the n bits for r times to an information bit channel to transmit, and transmits bits obtained by repeating the n bits selected from the information bit sequence to be transmitted for r times by using the frozen bit channels or maps the new bit sequence bit by bit onto K+n*(r−1) bit channels with highest reliability, where the selected n bits are the first n consecutive bits in the information bit sequence to be transmitted, or n inconsecutive bits in the information bit sequence to be transmitted.

Optionally, the encoding module performs the polar encoding on the information bit sequence to be transmitted in a manner described below.

In condition that the code block number is C>1, the encoding module divides the information bit sequence to be transmitted into C vector segments, performs the polar encoding on each of the C vector segments to obtain a code block of length C*$N_0$, and selects M bits from the code block of length C*$N_0$ to obtain the code block with the length of M bits.

Alternatively, when $\Delta>0$, $\Delta$ bits are selected from each code segment with a length of $N_0$ bits to be added to the end of the code segment with the length of $N_0$ bits to obtain a code segment with a length of $N_0+\Delta$ bits, C code segments are concatenated to obtain the code block of length $C^*(N_0+\Delta)$, and the M bits are selected from the code block of length $C^*(N_0+\Delta)$ to obtain the code block with the length of M bits.

Optionally, the encoding module divides the information bit sequence into the C vector segments in a manner described below.

The encoding module may equally divide the information bit sequence into C sub-information bit sequences. Furthermore, the C sub-information bit sequences may include C1 sub-information bit sequences of length $$\left\lfloor \frac{K}{C} \right\rfloor$$

and C2 sub-information bit sequences of length $$\left\lfloor \frac{K}{C} \right\rfloor + 1,$$

where $$C1 = K - \left\lfloor \frac{K}{C} \right\rfloor * C,$$

and C2=C−C1.

Optionally, the encoding module divides the information bit sequence into the C vector segments in a manner described below.

The transmitting node selects C−1 vector segments of length $K_0$ from the information bit sequence to be transmitted, where $K_0 = \lfloor N_0 * R \rfloor$, and takes the remaining bits in the information bit sequence to be transmitted as a C-th vector segment.

Optionally, the encoding module is further configured to process the information bit sequence to obtain the C code blocks and concatenate the C code blocks.

Optionally, before the encoding module processes the information bit sequence to obtain the C code blocks, the encoding module is further configured to: when the code block number is C>1, perform CRC encoding on the information bit sequence and divide the CRC encoded information bit sequence into segments, or divide the information bit sequence into C information bit sequences and perform the CRC encoding on each of the C information bit sequences.

Alternatively, the CRC encoding is performed on the information bit sequence to be transmitted, the CRC encoded information bit sequence is divided into segments, and the CRC encoding is performed on each of the segments.

Optionally, the encoding module concatenates the C code blocks in one of the manners described below.

Each of the C code blocks is interleaved respectively and connected end to end.

The C code blocks are interleaved after the C code blocks are connected end to end or interlaced.

Each of the C code blocks is configured as an information bit sequence, and Reed-Muller (RM) encoding or the polar encoding or packet encoding is performed on the information bit sequence.

This embodiment further provides a transmitting node including the data processing apparatus provided in the above-mentioned embodiments. The data processing apparatus may also employ any one or more optional solutions in the above-mentioned embodiments.

Figure 9:
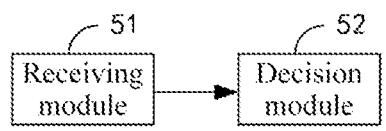
FIG. 9 is a structural diagram of another data processing apparatus according to an embodiment of the present disclosure.

This embodiment further provides a data processing apparatus which may be disposed in a receiving node. As shown in FIG. 9, the apparatus may include a receiving module 51 and a decision module 52.

The receiving module 51 is configured to receive a code block and encoding information of the code block transmitted by a transmitting node. The code block is obtained by performing polar encoding by the transmitting node on an information bit sequence to be transmitted according to a code block length $N_0$. The code block length $N_0$ is determined by the transmitting node according to a data characteristic for representing the information bit sequence to be transmitted and a preset parameter corresponding to the data characteristic.

The decision module 52 is configured to calculate likelihood ratio information by using the encoding information, and obtain a decision result according to the likelihood ratio information.

Optionally, $N_0$ may be set according to scenarios which may include a link direction or different types of channels. For example, one value is set for an UL channel, one value is set for a DL control channel, and one value is set for a DL traffic channel.

$N_0$ may be determined in the manner described in the above-mentioned embodiments.

Optionally, the receiving module is further configured to receive the encoding information transmitted by the transmitting node. The encoding information includes one or more of: the code block length, a code block number C, information about information bit channels, information about frozen bit channels, or repetition information.

Optionally, the decision module calculates the likelihood ratio information by using the encoding information in a manner described below.

The decision module calculates the likelihood ratio information according to the following formula:

$$L_N^i(y_1^N, \hat{u}_1^{i-1}) = \frac{W_N^i(y_1^N, \hat{u}_1^{i-1}|0)}{W_N^i(y_1^N, \hat{u}_1^{i-1}|1)}.$$

In the above formula, $$W_N^i(y_1^N, \hat{u}_1^{i-1}|0)$$

denotes a probability that a current bit is decided to be 0 according to a previously estimated information bit sequence $$\hat{u}_1^{i-1}, W_N^i(y_i^N, \hat{u}_1^{i-1}|1)$$

denotes a probability that the current bit is decided to be 1 according to the previously estimated information bit sequence $$\hat{u}_1^{i-1},$$

i is an index of the bit channel, and $1 \leq i \leq N_0$.

The decision module obtains the decision result according to the likelihood ratio information by the following formula:

$$\hat{u}_i = \begin{cases} 0, & L_N^i(y_1^N, \hat{u}_1^{i-1}) \geq 1 \\ 1, & \text{otherwise} \end{cases}.$$

Optionally, the decision module obtains the decision result according to the likelihood ratio information in a manner described below.

If it is determined that information transmitted by the transmitting node is repeated according to the encoding information, the likelihood ratio information of the corresponding bit channels is combined according to the repetition information, and the decision result is obtained according to the combined likelihood ratio information.

Optionally, after the decision module obtains the decision result according to the combined likelihood ratio information, the decision module is further configured to: if the decision result obtained according to the combined likelihood ratio information is inconsistent with the decision result before combination, reverse the decision result before the combination. Furthermore, according to other decision results obtained before the decision result is obtained according to the combined likelihood ratio information and the reversed decision to make a second decision.

Optionally, after the decision result is obtained according to the likelihood ratio information, the decision module is further configured to decode the code block according to the information about the information bit channels and the information about the frozen bit channels.

Optionally, the encoding information further includes concatenation information.

The code block is C code blocks concatenated.

After the decision result is obtained according to the likelihood ratio information, the decision module is further configured to: if the code block number is C>1, de-concatenate the code block according to the concatenation information to obtain the C code blocks and decode each of the C code blocks according to the information about the information bit channels and the information about the frozen bit channels. Optionally, the decision module de-concatenates the code block according to the concatenation information to obtain the C code blocks in a manner described below.

The decision module performs de-interleaving or decoding according to the concatenation information to obtain the C code blocks. The decoding includes any one of: RM decoding, polar decoding, and packet decoding.

Optionally, the decision module is further configured to perform an operation described below.

Paths are clipped according to the information about the check bits or a CRC encoding result to reserve likelihood ratios of L paths.

This embodiment further provides a receiving node which may include the data processing apparatus provided in the above-mentioned embodiments. The data processing apparatus may also employ any one or more optional solutions in the above-mentioned embodiments.

Figure 10:
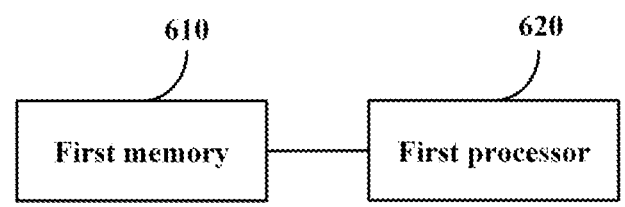
FIG. 10 is a structural diagram of a data processing device according to an embodiment of the present disclosure.

This embodiment further provides a data processing device. As shown in FIG. 10, the device may include a first memory 610 and a first processor 620.

The first memory 610 is configured to store programs.

The first processor 620 is configured to execute the programs to perform the operations described below.

A code block length $N_0$ for encoding an information bit sequence to be transmitted is determined according to a data characteristic for representing the information bit sequence to be transmitted and a preset parameter corresponding to the data characteristic. Polar encoding is performed on the information bit sequence to be transmitted according to the code block length $N_0$. A code block obtained through the polar encoding is transmitted to a receiving node.

The data processing device may also perform any data processing method provided in the above-mentioned embodiments.

In this embodiment, other implementation details of the operations performed by the first processor 620 by executing the programs may be referred to the data processing method provided in the above-mentioned embodiments.

Figure 11:
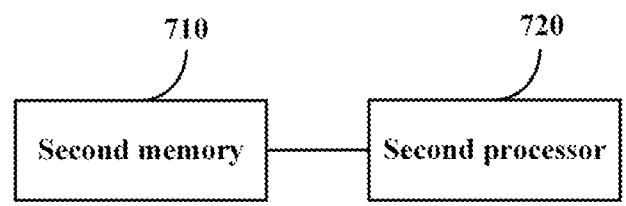
FIG. 11 is a structural diagram of another data processing device according to an embodiment of the present disclosure.

This embodiment further provides a data processing device. As shown in FIG. 11, the device may include a second memory 710 and a second processor 720.

The second memory 710 is configured to store programs.

The second processor 720 is configured to execute the programs to perform the operations described below.

A code block and encoding information of the code block transmitted by a transmitting node are received. The code block is obtained by performing polar encoding by the transmitting node on an information bit sequence to be transmitted according to a code block length $N_0$. The code block length $N_0$ is determined by the transmitting node according to a data characteristic for representing the information bit sequence to be transmitted and a preset parameter corresponding to the data characteristic. Likelihood ratio information is calculated by using the encoding information, and a decision result is obtained according to the likelihood ratio information.

In this embodiment, other implementation details of the operations performed by the second processor 720 by executing the programs may be referred to the data processing method provided in the above-mentioned embodiments.

The first memory 610 and the second memory 710 may both include a program storage region and a data storage region. The program storage region may store an operating system and an application program required by at least one function. The data storage region may store data created according to the use of the device and the like. In addition, the memory may include, for example, a volatile memory such as a random access memory, and may also include a non-volatile memory such as at least one disk memory, a flash memory, or other non-transient solid-state memories.

In addition, the logic instructions in the memory 610 and the second memory 710 may be implemented in the form of a software functional unit and, when sold or used as an independent product, may be stored in a computer-readable storage medium. The technical solutions provided by the present disclosure may be embodied in the form of a computer software product. The computer software product may be stored in a storage medium and includes several instructions for enabling a computer device (which may be a personal computer, a server, a network device, or the like) to execute all or part of the steps in the methods provided by the embodiments of the present disclosure. The storage medium may be a non-transient storage medium, or may also be a transient storage medium. The non-transient storage medium may include: a USB flash disk, a mobile hard disk, a read-only memory (ROM), a random access memory (RAM), a magnetic disk, an optical disk, or another medium capable of storing program codes.

This embodiment further provides a computer-readable storage medium storing computer-executable instructions for executing any method described above.

All or part of the processes in the methods according to the above-mentioned embodiments may be implemented by relevant hardware indicated by computer programs, which may be stored in a non-transient computer-readable storage medium. During these programs are executed, the processes in the methods according to the above-mentioned embodiments may be implemented.

INDUSTRIAL APPLICABILITY

The data processing method and apparatus provided by the present disclosure may prevent a code block from being frequently and dynamically changed and facilitate hardware implementation.

What is claimed is:

1. A method, comprising:
   determining, by a transmitting node, a code block length $N_0$ for polar encoding of an information bit sequence according to a data characteristic, wherein the data characteristic comprises a link direction, the link direction comprising a downlink direction or an uplink direction;
   determining, by the transmitting node, a code block number C according to the code block length $N_0$ and a practical code block length N, wherein the code block length $N_0$ satisfies a generation matrix of the polar encoding $Gn_0 = F^{\otimes n_0}$, where $\otimes$ denotes a kronecker power, $$F = \begin{bmatrix} 1 & 0 \\ 1 & 1 \end{bmatrix},$$

$n_0$ is a positive integer, and $n_0 = \log_2 N_0$;
   generating one or more code blocks according to the code block length $N_0$ by performing, by the transmitting node, the polar encoding of the information bit sequence; and
   transmitting, by the transmitting node, the one or more code blocks obtained through performing the polar encoding.

2. The method of claim 1, further comprising:
   determining, by the transmitting node, the code block number C according to a fixed increment $\Delta$, and wherein:
   when $N > N_0 + \Delta$, the transmitting node performs code block segmentation on the information bit sequence, and the code block number is C=2, and
   when $N \leq N_0 + \Delta$, the code block number is C=1, and the code block segmentation is not performed.

3. The method of claim 1, further comprising:
   determining, by the transmitting node prior to performing the polar encoding, the code block number C according to a length of the information bit sequence, wherein when K is the length of the information bit sequence, and $K_{max}$ is a length of a preset maximum information bit sequence:
   when $K > K_{max}$ the transmitting node performs code block segmentation on the information bit sequence, and C=2; and
   when $K \leq K_{max}$, the code block number is C=1, and the code block segmentation is not performed.

4. The method of claim 1, wherein the data characteristic comprises a channel type, the channel type comprising a physical downlink control channel (PDCCH), a physical broadcast channel (PBCH), or a physical uplink control channel (PUCCH).

5. The method of claim 1, comprising performing, by the transmitting node, the polar encoding on the information bit sequence according to the code block number C, which comprises:
   when the code block number is C=2, dividing, by the transmitting node, the information bit sequence into C vector segments; performing the polar encoding on each of the C vector segments to obtain a code block of length $C*N_0$; and determining M bits from the code block of length $C*N_0$ to obtain a code block with a length of M bits.

6. The method of claim 5, wherein the dividing, by the transmitting node, the information bit sequence into the C vector segments comprises:
   equally dividing, by the transmitting node, the information bit sequence into C sub-information bit sequences.

7. The method of claim 1, further comprising:
   concatenating, by the transmitting node after processing the information bit sequence to obtain the C code blocks, the C code blocks by:
   interleaving each of the C code blocks, and connecting the interleaved C code blocks end to end.

8. The method of claim 1, further comprising:
   dividing, by the transmitting node prior to processing the information bit sequence to obtain the C code blocks, the information bit sequence into C information bit sequences; and
   performing cyclic redundancy check (CRC) encoding on each of the C information bit sequences.

9. A transmitting node, comprising:
   at least one processor configured to:
   determine a code block length No for polar encoding of an information bit sequence according to a data characteristic, wherein the data characteristic comprises a link direction, the link direction comprising a downlink direction or an uplink direction;
   determine a code block number C according to the code block length No and a practical code block length N, wherein the code block length No satisfies a generation matrix of the polar encoding $Gn_0 = F^{\otimes n0}$, where $\otimes$ denotes a kronecker power, $$F = \begin{bmatrix} 1 & 0 \\ 1 & 1 \end{bmatrix},$$

$n_0$ is a positive integer, and $n_0 = \log_2 N_0$;
   generate one or more code blocks according to the code block length No by performing, by the transmitting node, the polar encoding of the information bit sequence; and
   transmit, via a transmitter, the one or more code blocks obtained through performing the polar encoding.

10. The transmitting node of claim 9, wherein the at least one processor is configured to:
    determine the code block number C according to a fixed increment $\Delta$, and wherein:
    when $N > N_0 + \Delta$, the at least one processor configured to perform code block segmentation on the information bit sequence, and the code block number is C=2, and when $N \leq N_0+\Delta$, the code block number is C=1, and the code block segmentation is not performed.

11. The transmitting node of claim 9, wherein the at least one processor is configured to:
determine, prior to performing the polar encoding, the code block number C according to a length of the information bit sequence, wherein when K is the length of the information bit sequence, and $K_{max}$ is a length of a preset maximum information bit sequence:
when $K > K_{max}$ the at least one processor configured to perform code block segmentation on the information bit sequence, and C=2; and
when $K < K_{max}$, the code block number is C=1, and the code block segmentation is not performed.

12. The transmitting node of claim 9, wherein the data characteristic comprises a channel type, the channel type comprising a physical downlink control channel (PDCCH), a physical broadcast channel (PBCH), or a physical uplink control channel (PUCCH).

13. The transmitting node of claim 9, wherein the at least one processor is configured to perform the polar encoding on the information bit sequence according to the code block number C, which comprises:
when the code block number is C=2, dividing the information bit sequence into C vector segments; performing the polar encoding on each of the C vector segments to obtain a code block of length $C*N_0$; and determining M bits from the code block of length $C*N_0$ to obtain a code block with a length of M bits.

14. The transmitting node of claim 13, wherein the at least one processor is configured to divide the information bit sequence into the C vector segments, which comprises:
equally dividing the information bit sequence into C sub-information bit sequences.

15. The transmitting node of claim 9, wherein the at least one processor is configured to:
concatenate, after processing the information bit sequence to obtain the C code blocks, the C code blocks by:
interleaving each of the C code blocks, and connecting the interleaved C code blocks end to end.

16. The transmitting node of claim 9, wherein the at least one processor is configured to:
divide, prior to processing the information bit sequence to obtain the C code blocks, the information bit sequence into C information bit sequences; and
perform cyclic redundancy check (CRC) encoding on each of the C information bit sequences.

17. A method, comprising:
receiving, by a receiving node, one or more code blocks obtained through performing polar encoding,
wherein the one or more code blocks are generated according to a code block length $N_0$ by performing the polar encoding of an information bit sequence, the code block length $N_0$ is determined according to a data characteristic, and a code block number C is determined according to the code block length $N_0$ and a practical code block length N, wherein the data characteristic comprises a link direction, the link direction comprising a downlink direction or an uplink direction, wherein the code block length $N_0$ satisfies a generation matrix of the polar encoding $G_{n0}=F^{\otimes n0}$, where $\otimes$ denotes a kronecker power, $$F = \begin{bmatrix} 1 & 0 \\ 1 & 1 \end{bmatrix},$$

$n_0$ is a positive integer, and $n_0=\log_2 N_0$.

18. A receiving node, comprising:
at least one processor configured to receive, via a receiver, one or more code blocks obtained through performing polar encoding,
wherein the one or more code blocks are generated according to a code block length $N_0$ by performing the polar encoding of an information bit sequence, the code block length $N_0$ is determined according to a data characteristic, and a code block number C is determined according to the code block length No and a practical code block length N, wherein the data characteristic comprises a link direction, the link direction comprising a downlink direction or an uplink direction, wherein the code block length $N_0$ satisfies a generation matrix of the polar encoding $G_{n0}=F^{\otimes n0}$, where $\otimes$ denotes a kronecker power, $$F = \begin{bmatrix} 1 & 0 \\ 1 & 1 \end{bmatrix},$$

$n_0$ is a positive integer, and $n_0=\log_2 N_0$.

* * * * *

UNITED STATES PATENT AND TRADEMARK OFFICE
CERTIFICATE OF CORRECTION

PATENT NO. : 11,909,417 B2
APPLICATION NO. : 17/825567
DATED : February 20, 2024
INVENTOR(S) : Saijin Xie et al.

Page 1 of 1

It is certified that error appears in the above-identified patent and that said Letters Patent is hereby corrected as shown below:

In the Claims

In Claim 9, Column 28, Line 39, please delete "No" and insert -- $N_0$ --

In Claim 9, Column 28, Line 45, please delete "No" and insert -- $N_0$ --

In Claim 9, Column 28, Line 56, please delete "No" and insert -- $N_0$ --

In Claim 18, Column 30, Line 32, please delete "No" and insert -- $N_0$ --

Signed and Sealed this
Eleventh Day of March, 2025

Coke Morgan Stewart
*Acting Director of the United States Patent and Trademark Office*